United States Patent [19]

Mehl

[11] Patent Number: 4,609,832
[45] Date of Patent: Sep. 2, 1986

[54] INCREMENTAL BASE DRIVE CIRCUIT FOR A POWER TRANSISTOR

[75] Inventor: Byron R. Mehl, Belvidere, Ill.

[73] Assignee: Sundstrand Corporation, Rockford, Ill.

[21] Appl. No.: 542,147

[22] Filed: Oct. 14, 1983

[51] Int. Cl.⁴ .......................................... H03K 17/08
[52] U.S. Cl. .................................. 307/270; 307/243; 307/570; 307/296 R; 307/494
[58] Field of Search ............................. 307/362–363, 307/494, 243, 570, 574, 575, 581, 254, 270, 296 R, 300; 323/282–284, 289, 290

[56] References Cited

U.S. PATENT DOCUMENTS

| | | | |
|---|---|---|---|
| 3,879,619 | 4/1975 | Pleshko | 307/570 |
| 4,055,794 | 10/1977 | Ickes et al. | 307/300 X |
| 4,303,841 | 12/1981 | Baker | 307/570 |
| 4,404,478 | 9/1983 | Rischmuller | 307/254 X |
| 4,480,201 | 10/1984 | Jaeschke | 307/570 |

Primary Examiner—Stanley D. Miller
Assistant Examiner—D. R. Hudspeth
Attorney, Agent, or Firm—Wood, Dalton, Phillips, Mason & Rowe

[57] ABSTRACT

A base drive circuit for a power transistor includes a plurality of discrete current sources. A condition of the power transistor circuit, which is a function of the transistor current, is sensed and controls the number of discrete current sources that are activated.

10 Claims, 5 Drawing Figures

INCREMENTAL BASE DRIVE CIRCUIT FOR A POWER TRANSISTOR

FIELD OF THE INVENTION

This invention relates to a base drive circuit for a power transistor.

BACKGROUND OF THE INVENTION

A power transistor used in the switched mode, as in an inverter or converter, should be driven to saturation (or quasi-saturation) to minimize the voltage drop across the transistor. The base drive current required is a function of the transistor collector current.

A commonly used circuit provides base current sufficient to achieve saturation for peak transistor current. This approach has the advantage of simplicity but is inefficient when the transistor handles less than peak current.

Proportional base drive circuits are known in which base current is continuously adjusted as a function of the collector current. Such circuits are complex and expensive.

SUMMARY OF THE INVENTION

This invention represents an intermediate approach which utilizes a plurality of discrete current sources for the base element of the transistor and activates one or more of the sources as a function of a control signal related to the power transistor collector current.

In accordance with the invention the base drive circuit includes a source of control signal related to the collector current of the power transistor, a plurality of discrete current sources and means responsive to the control signal for connecting an appropriate number of the discrete current sources with the transistor base element.

Another feature of the invention is that an analog control signal represents the transistor collector current and that a threshold detector (or detectors) is responsive to the analog signal to activate one or more discrete current sources.

A further feature of the invention is that a digital control signal represents the transistor collector current and that a decoder is responsive to the digital signal to activate one or more discrete current sources.

Yet another feature is that an on-off signal for the transistor actuates one discrete current source and provides one input to a two input AND gate. A signal derived from the control signal provides the other input to the AND gate which in turn actuates another discrete current source.

Further features and advantages of the invention will readily be apparent from the specification and from the drawings.

Figure 1:
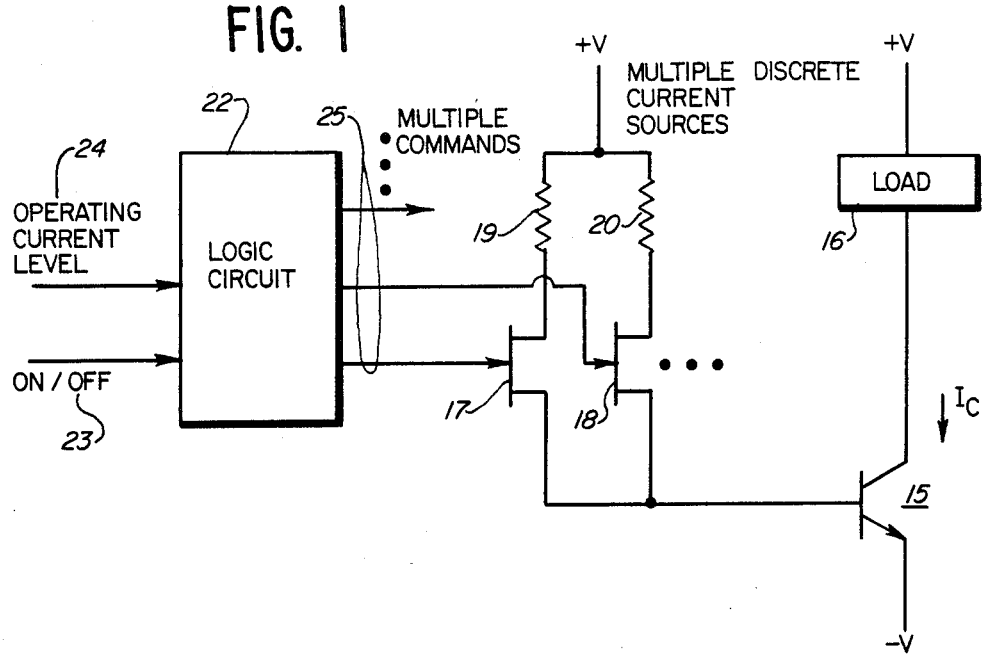
FIG. 1 is a circuit diagram illustrating the invention.

The general aspects of the invention are illustrated in FIG. 1. Power transistor 15 has a collector-emitter circuit connected through load 16 across the positive and negative terminals $+V$, $-V$ of a DC power supply. The base element of the transistor is connected with a base current source provided by the power supply $+V$ through a plurality of parallel connected FET switches 17, 18 and series resistors 19, 20 which establish the increments of current for transistor 15. Logic circuit 22 has inputs of an on-off signal 23 for transistor 15 and a control signal 24 representing the operating current level for the transistor. Logic circuit 22 has multiple command signal outputs 25, one connected with the gate element of each of the base current FET switches 17, 18. The number of FET's turned on depends on the operating current level and determines the base current to transistor 15. Two FET's 17, 18 are shown. More may be used as indicated by the dots adjacent the FET circuits and the command signal outputs 25.

The operating current level signal may be derived directly from the circuit of power transistor 15, from load 16 or from the system in which the power transistor and load are connected. For example, transistor 15 may be one of the power switch transistors in a DC to AC inverter circuit. In this situation, load 16 represents a portion of the load supplied by the inverter. On-off signal 23 might be provided by a pulse width modulated driver circuit. Control signal 24 could be derived directly from the circuit of transistor 15 or from some other point in the inverter or in the circuits powered by the inverter.

One power transistor 15 is shown. The base drive circuit can be applied to a plurality of parallel or Darlington connected transistors. The base drive switches may be bipolar transistors or other switching devices rather than FET's.

Several specific embodiments of the invention are shown in FIGS. 2–5 illustrating different combinations of means for developing a control signal representing the collector current of the power transistor and for implementing the logic circuits which control the discrete base current sources. Other combinations and circuits will be apparent to those skilled in the art.

Figure 2:
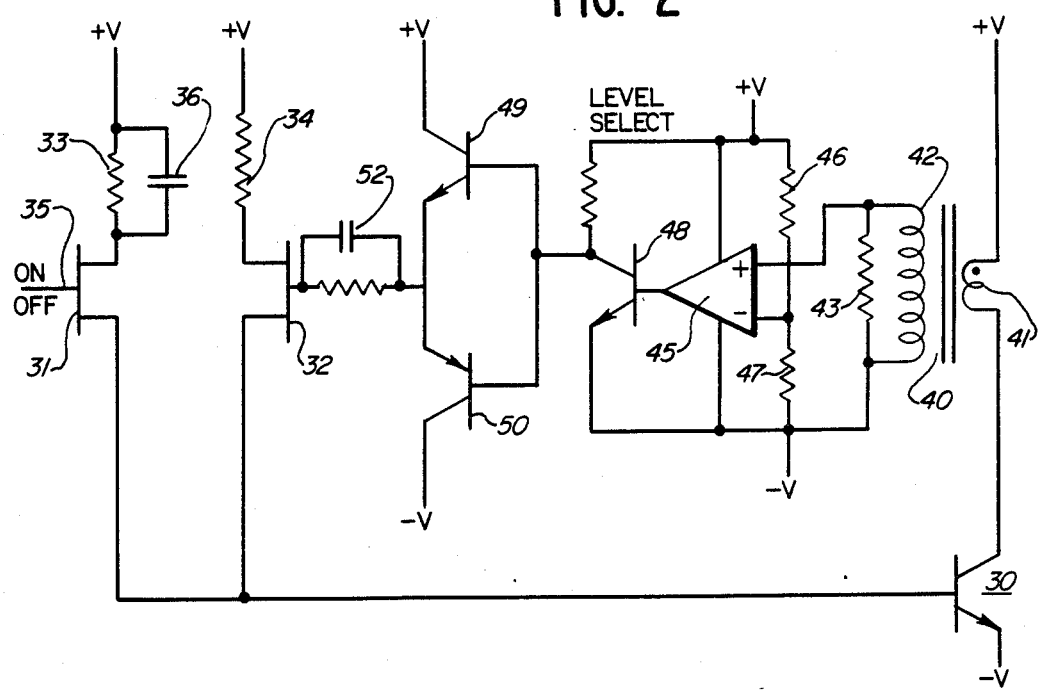
FIG. 2 is a schematic diagram of an embodiment of the invention responsive directly to collector current.

Considering first the circuit of FIG. 2, the collector-emitter circuit of power transistor 30 is shown connected between the positive and negative power supply terminals $+V$, $-V$. The load is not shown. Two FET switches 31, 32 are connected from the positive source $+V$ through current limiting resistors 33, 34 with the base of transistor 30. On-off signal 35 is connected with the gate of FET 31 and goes high to indicate an on condition, providing the first increment of base current for transistor 30. Capacitor 36 connected in parallel with current limiting resistor 33 shapes the leading edge of the current pulse applied to the base of transistor 30 through FET switch 31.

A current transformer 40 has a primary winding 41 connected in the collector-emitter circuit of transistor 30 and a secondary winding 42 across which burden resistor 43 is connected. The operating current level control signal from the current transformer is connected with the noninverting input of an operational amplifier comparator 45 which is connected across the positive and negative terminals of the power supply. The inverting input of comparator 45 is connected with a voltage divider of resistors 46, 47 establishing a reference or threshold. When the current of transistor 30 exceeds the threshold, the output of comparator 45 goes high, causing buffer transistor 48 to conduct and in turn causing series connected switching transistors 49, 50 to conduct. The emitters of switching transistors 49, 50 are connected through an RC circuit 52 with the gate of FET 32, causing it to conduct and adding an increment of base drive to transistor 30. Comparator 45 and the associated switching circuit can be duplicated, with different threshold values, for additional elements of base drive current.

Figure 3:
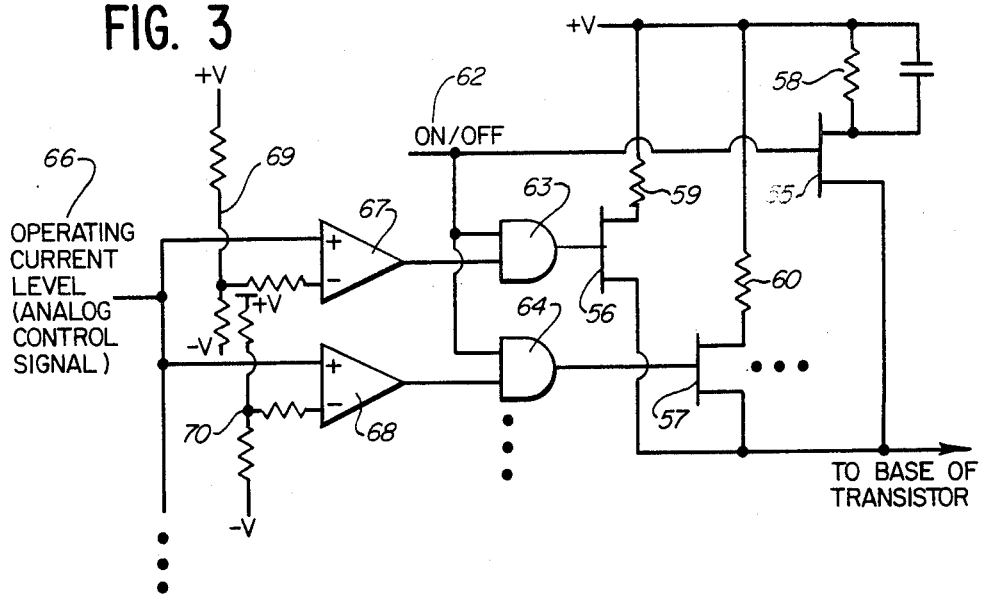
FIGS. 3 and 4 illustrate circuits responsive respectively to analog and digital control signals.
Figure 4:
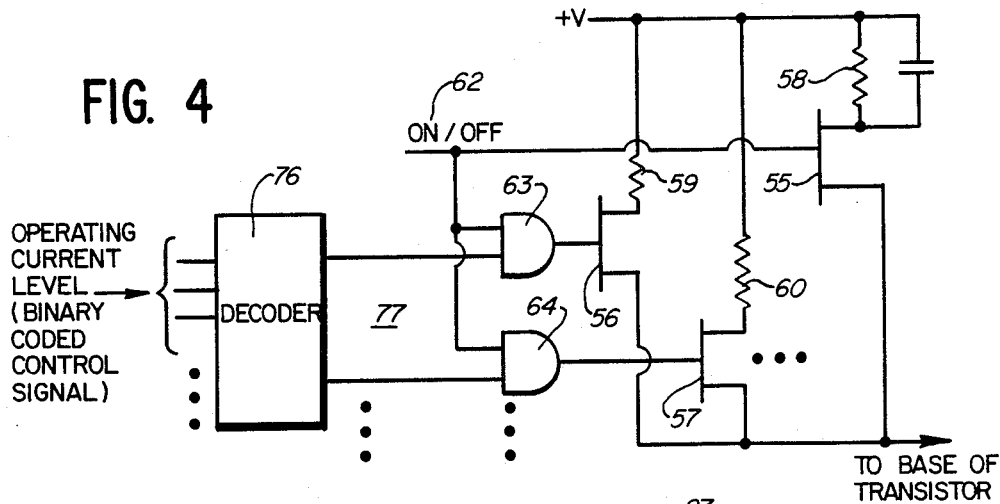

FIGS. 3 and 4 show more complex multiple base drive current circuits with on-off signal gating. In each, FET switches 55, 56 and 57 are connected in parallel between the current source and the base of the power transistor, not shown. Resistors 58, 59 and 60 in series with FET's 55, 56, 57, respectively, establish the current increments for the power transistor base circuit. Additional FET switches may be provided if further increments of current are desired.

An on-off signal 62 is connected with the gate of FET 55 providing the initial increment of current to the power transistor. The on-off signal is also connected with one of the inputs of each of the two-input AND gates 63, 64.

In FIG. 3 the operating current level is represented by an analog control signal 66 connected with noninverting inputs of operational amplifier threshold detectors 67, 68. The inverting inputs of the operational amplifiers are connected with resistive voltage dividers 69, 70, respectively, connected across the terminals of the power source. Each of the threshold detectors has a different threshold voltage established by the voltage divider.

The power transistor (not shown) conducts upon occurrence of the on signal 62, with the base current supplied by FET 55. When analog control signal 66 exceeds the threshold for threshold detector 67, the output of detector 67 goes high, the output of AND gate goes high and FET 56 conducts adding a second increment of base current to the power transistor. Similarly, when control signal 66 exceeds the threshold for detector 68, the output of AND gate 64 goes high and FET 57 conducts adding a third increment of base current. When the on-off signal 62 terminates, the outputs of AND gates 63, 64 go low and FET switches 56, 57 turn off the base current to the power transistor.

In the circuit of FIG. 4 the operating current level is provided by a binary coded digital control signal 65 connected with the inputs of decoder 76. The outputs 77 of the decoder represent different levels of operating current and are connected with the second inputs of AND gates 63, 64.

On-off signal 62 activates FET switch 55 supplying the first increment of base current to the power transistor (not shown). The outputs 77 of decoder 76 act through the AND gates 63, 64 to activate FET's 56, 57 and supply additional elements of base current to the power transistor, as required by the operating current level of the signal 75. When on-off signal 62 goes to the off or low condition, all base current to the power transistor is turned off.

Figure 5:
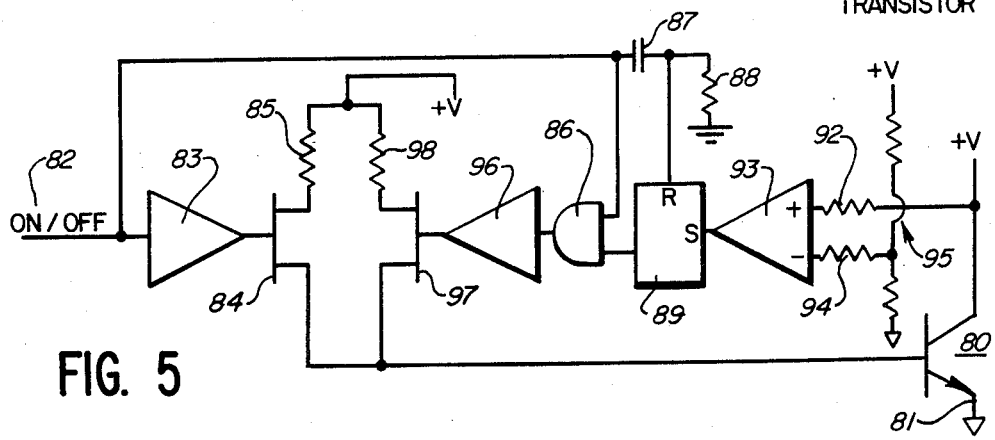
FIG. 5 is a schematic diagram of a circuit responsive to the collector to emitter voltage of the power transistor.

FIG. 5 illustrates a circuit in which the operating current level signal is obtained from the collector-emitter voltage of power transistor 80. The collector element of transistor 80 is connected with the positive supply +V and the emitter is returned to ground reference 81. The on-off signal 82 is connected through a driver 83 with FET 84 which supplies a first increment of base current through resistor 85. The on-off signal is also connected with one of the inputs of AND gate 86 and through a differentiator circuit of capacitor 87 and resistor 88 to the reset input R of latch circuit 89. The output of the latch circuit is connected with the other input of AND gate 86. When the latch circuit is reset the latch output is low and the output of AND gate 86 is low.

The collector voltage of power transistor 80 is connected through series resistor 92 with the noninverting input of operational amplifier threshold detector 93. The inverting input of the detector is connected through series resistor 94 with a voltage divider 95 which establishes the threshold level. When the collector voltage exceeds the threshold, indicating that the base drive is insufficient for the current through the transistor, the output of threshold detector 93 goes high setting the latch 89. Latch output goes high as does the output of AND gate 86. This signal is connected through driver 96 with FET 97 causing the FET to conduct and add a second increment of base current through resistor 98 to transistor 80. The added base drive causes the collector-emitter voltage to drop. Even if the output of threshold detector 93 goes low, the output of latch circuit 89 remains high. When the on-off signal 82 is terminated, both FET switches 84 and 97 are turned off, interrupting the base current to the power transistor. Latch circuit 89 remains set until the next occurrence of on signal 82 which causes it to reset.

I claim:

1. A base drive circuit for a power transistor having base, collector and emitter elements and a load circuit connected in series with the collector and emitter elements, comprising:
   a source of control signal which represents an operating current level of said transistor wherein said control signal is a digital signal;
   a plurality of discrete current sources for providing increments of base current to the base element of said transistor; and
   means responsive to said control signal for connecting a controlled number of said discrete current sources with the base element of said transistor to provide the desired base current dependent on the operating current level.

2. The base drive circuit of claim 1 in which said digital signal is a binary coded signal, and including a decoder responsive to the binary coded signal and having a plurality of outputs one connected with each discrete current source.

3. The base drive circuit of claim 2 including:
   a source of on-off signal for the transistor, a first discrete current source responsive to said on-off signal to provide a first increment of the base drive current to said transistor; and
   a plurality of additional discrete current sources each responsive to a different output of said decoder.

4. The base drive circuit of claim 3 including a plurality of AND gates connected between the outputs of the decoder and each discrete current source, each AND gate having an input connected with the on-off signal source and another input connected with one of the outputs of the decoder.

5. A base drive circuit for a power transistor having base, collector and emitter elements and a load circuit connected in series with the collector and emitter elements, comprising:
   a source of analog control signal representing an operating current level of said transistor;

a plurality of discrete current sources providing increments of base current to the base element of said transistor; and means responsive to said control signal for connecting a controlled number of said discrete current sources with the base element of said transistor to provide the desired base current dependent on the operating current level;

wherein the connecting means includes a plurality of threshold detectors each having an input responsive to said control signal and a different current level threshold, a discrete current source being responsive to each threshold detector.

6. The base drive circuit of claim 5 including:

a source of on-off signal for the transistor; and a first discrete current source responsive to said on-off signal to provide a first increment of base drive current to the transistor, the discrete current sources responsive to said threshold detectors providing additional increments of base drive current.

7. The base drive circuit of claim 6 including AND gates between each threshold detector and discrdte current source, each AND gate having an input connected with said on-off signal source and another input connected with the associated threshold detector.

8. A base drive circuit for a power transistor having base, collector and emitter elements in a load circuit connected in series with the collector and emitter elements, comprising:

a source of analog control signal representing an operating current level of said transistor;

a source of on-off signal for the transistor;

a first discrete current source responsive to said on-off signal to provide a first increment of base drive current to said transistor;

a threshold detector responsive to said control signal, connected with a second discrete current source to provide a second increment of base current to said transistor;

an AND gate having inputs connected with the on-off signal source and with the threshold detector and an output connected with said second discrete current source; and means responsive to said control signal for connecting a controlled number of said discrete current sources with the base element of said transistor to provide the desired base current dependent on the operating current level.

9. The base drive circuit of claim 8 including a latch circuit having an output connected to said AND gate, a SET input connected with the threshold detector and a RESET input connected with said on-off signal source.

10. A base drive circuit for a power transistor having base, collector and emitter elements and a load circuit connected in series with the collector and emitter elements, comprising:

a source of analog control signal derived from the collector-emitter voltage of the transistor;

a source of on-off signal for the transistor;

a first discrete current source responsive to said on-off signal to provide a first increment of base drive current to said transistor;

a threshold detector responsive to said control signal, connected with a second discrete current source to provide a second increment of base drive current to said transistor;

an AND gate having inputs connected with the on-off signal source and with the threshold detector and an output connected with said discrete current source;

a latch circuit having an output connected with said AND gate, a SET input connected with the threshold detector and a RESET input connected with said on-off signal source; and means responsive to said control signal for connecting a controlled number of said discrete current sources with the base element of said transistor to provide the desired base current dependent on the operating current level.

* * * * *